United States Patent
Hoshikawa et al.

(10) Patent No.: US 11,930,599 B2
(45) Date of Patent: Mar. 12, 2024

(54) CONSTITUTIVE DEVICE QUALITY DETERMINATION SERVER, INSPECTION SYSTEM, INSPECTION SYSTEM TERMINAL DEVICE, AND INSPECTION DEVICE

(71) Applicant: FUJI CORPORATION, Chiryu (JP)

(72) Inventors: Kazumi Hoshikawa, Toyohashi (JP); Hiroshi Murakami, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 801 days.

(21) Appl. No.: 16/982,811

(22) PCT Filed: Mar. 22, 2018

(86) PCT No.: PCT/JP2018/011298
§ 371 (c)(1),
(2) Date: Sep. 21, 2020

(87) PCT Pub. No.: WO2019/180861
PCT Pub. Date: Sep. 26, 2019

(65) Prior Publication Data
US 2021/0037686 A1 Feb. 4, 2021

(51) Int. Cl.
*H05K 13/00* (2006.01)
*H05K 13/04* (2006.01)
*H05K 13/08* (2006.01)

(52) U.S. Cl.
CPC ......... *H05K 13/08* (2013.01); *H05K 13/0015* (2013.01); *H05K 13/0061* (2013.01); *H05K 13/04* (2013.01)

(58) Field of Classification Search
CPC ............... H05K 13/08; H05K 13/0015; H05K 13/0061; H05K 13/04; H05K 13/083
See application file for complete search history.

(56) References Cited

U.S. PATENT DOCUMENTS

2009/0046921 A1* 2/2009 Case ............... H05K 13/0812
700/109
2009/0259333 A1* 10/2009 Yano ................ G06Q 10/10
700/121
(Continued)

FOREIGN PATENT DOCUMENTS

JP 5-35751 A 2/1993
JP 2000-236197 A 8/2000
(Continued)

OTHER PUBLICATIONS

International Search Report dated Jun. 5, 2018 in PCT/JP2018/001296 filed on Mar. 22, 2018, citing AO-AS, 2 pages.

*Primary Examiner* — Kidest Bahta
(74) *Attorney, Agent, or Firm* — Oblon, McClelland, Maier & Neustadt, L.L.P.

(57) ABSTRACT

A constitutive device quality determination server is communicably connected to an inspection device via the internet, the inspection device performing an inspection on a constitutive device configuring a board work machine by operating the constitutive device in accordance with to a type of the inspection, and includes an inspection data acquisition section that designates a predetermined type of the inspection for the inspection device and acquires inspection data obtained by the inspection by the inspection device, a determination section that determines quality of the constitutive device based on the acquired inspection data, and a transmission section that transmits a quality determination result determined by the determination section to a terminal device communicably connected over the internet.

15 Claims, 6 Drawing Sheets

(56) References Cited

U.S. PATENT DOCUMENTS

2010/0125359 A1* 5/2010 Doyle ................ H05K 13/0061
700/114
2017/0023931 A1* 1/2017 Sanji .................. G05B 19/4155

FOREIGN PATENT DOCUMENTS

| JP | 2002-181728 A | 6/2002 |
| JP | 2004-134774 A | 4/2004 |
| JP | 2014-27064 A | 2/2014 |
| WO | WO 2013/153598 A1 | 10/2013 |

* cited by examiner

Fig. 5

TRACE LOG M4

IDENTIFICATION INFORMATION

| TERMINAL DEVICE ID | INSPECTION DEVICE ID |
|---|---|
| TD-123 | ND-456 |

| TIME | OPERATION HISTORY | | | | | |
|---|---|---|---|---|---|---|
| | INSTRUCTION SIGNAL | CONTROL SIGNAL | NOTIFICATION INFORMATION | COMMUNICATION RECORD | OPERATION RECORD | ... |
| T11 | — | — | — | M11 | P11 | ... |
| T12 | C12 | — | — | — | — | ... |
| T13 | — | N13 | — | M13 | — | ... |
| T14 | — | — | F14 | M14 | — | ... |
| ⋮ | ⋮ | ⋮ | ⋮ | ⋮ | ⋮ | ⋮ |

CONSTITUTIVE DEVICE QUALITY DETERMINATION SERVER, INSPECTION SYSTEM, INSPECTION SYSTEM TERMINAL DEVICE, AND INSPECTION DEVICE

TECHNICAL FIELD

The present application relates to a constitutive device quality determination server, an inspection system, a terminal device for the inspection system, and an inspection device.

BACKGROUND ART

A board work machine used for manufacturing board products includes a component mounter for picking up supplied components and for mounting the components on a board. For example, multiple constitutive devices configuring the component mounter requires maintenance to maintain proper operation.

Patent Literature 1 discloses a maintenance device for performing a maintenance process on a mounting head as a constitutive device. In the maintenance device, an operation program for inspection, determination reference data serving as a reference for quality determination, and the like, are stored in advance.

PATENT LITERATURE

Patent Literature 1: WO 2013/153598

BRIEF SUMMARY

Technical Problem

In a case in which maintenance of the constitutive device of the board work machine is required, when the maintenance device is installed at a remote location with respect to the board work machine, the constitutive device is needed to be transported, which increases the time required to operate the constitutive device. For this reason, it is conceivable to transport the maintenance device to an installation site of the board work machine. However, since the maintenance device stores important information such as an operation program for inspection, determination reference data, and the like, moving the maintenance device to the work site may reduce the manageability in view of the information leakage.

It is an object of the present specification to provide a constitutive device quality determination server, an inspection system, a terminal device for the inspection system, and an inspection device, capable of improving the convenience and manageability of a maintenance process for the constitutive device.

Solution to Problem

The present specification discloses a constitutive device quality determination server that is communicably connected to an inspection device via the internet, the inspection device performing an inspection on a constitutive device configuring a board work machine by operating the constitutive device in accordance with a type of the inspection, and that includes an inspection data acquisition section configured to acquire inspection data obtained from a predetermined type of the inspection by the inspection device, a determination section configured to determine a quality of the constitutive device based on the acquired inspection data, and a transmission section configured to transmit a quality determination result determined by the determination section to a terminal device communicably connected via the internet.

The present specification discloses an inspection system including a terminal device configured to display various types of information, an inspection device configured to perform an inspection on a constitutive device configuring a board work machine by operating the constitutive device in accordance with a type of the inspection, and a constitutive device quality determination server communicably connected to the terminal device and the inspection device via the internet, and configured to acquire inspection data obtained by the inspection by the inspection device, determine a quality of the constitutive device based on the acquired inspection data, and transmit a quality determination result to the terminal device via the internet.

The present specification discloses a terminal device for an inspection system, in which the terminal device is applied to an inspection system for a constitutive device configuring a board work machine and displays various types of information, and the inspection system includes an inspection device configured to perform an inspection on the constitutive device by operating the constitutive device in accordance with a type of the inspection, and a constitutive device quality determination server communicably connected to the terminal device and the inspection device via the internet, and configured to designate a predetermined type of the inspection for the inspection device, acquire inspection data obtained by the inspection by the inspection device, and determine a quality of the constitutive device based on the acquired inspection data, and the terminal device displays a quality determination result of the constitutive devices transmitted from the constitutive device quality determination server via the internet.

The present specification discloses an inspection device for an inspection system, in which the inspection device is applied to an inspection system for a constitutive device configuring a board work machine and performs an inspection on the constitutive device by operating the constitutive device in accordance with a type of the inspection, and the inspection system includes a terminal device configured to display various types of information, a constitutive device quality determination server communicably connected to the inspection device and the terminal device via the internet and configured to acquire inspection data obtained by the inspection by the inspection device, determine a quality of the constitutive device based on the acquired inspection data, and transmit a quality determination result to the terminal device via the internet, and the inspection device is configured to perform a predetermined type of the inspection designated by the constitutive device quality determination server and transmit the inspection data obtained by the inspection to the constitutive device quality determination server.

Advantageous Effects

With the configuration, the constitutive device quality determination server in the inspection system may be configured as a separate device connected to the inspection device performing the inspection and the terminal device displaying the quality determination result via the internet. Accordingly, by transporting the inspection device to the installation site of the board work machine, or by transporting the constitutive device to the installation site of the inspection device, it is possible to perform the maintenance process and improve convenience. Meanwhile, since the quality determination is made by the constitutive device quality determination server, the inspection device and the terminal device are separated from important information for inspection. Therefore, leakage of such information can be reliably prevented, and the manageability of the maintenance process for the constitutive device can be improved.

BRIEF DESCRIPTION OF DRAWINGS

FIG. 5 is a diagram showing a trace log including an operation history of a constitutive device.

DESCRIPTION OF EMBODIMENTS

1. Overview of Inspection System 30

Hereinafter, particular embodiments of inspection system 30 will be described with reference to the drawings. Inspection system 30 enables a maintenance process including an inspection on a constitutive device configuring a board work machine. In the present embodiment, an aspect will be exemplified in which inspection system 30 is applied to inspect mounting head 20 of component mounter 3 as the board work machine.

2. Configuration of Production Line 1

Figure 1:
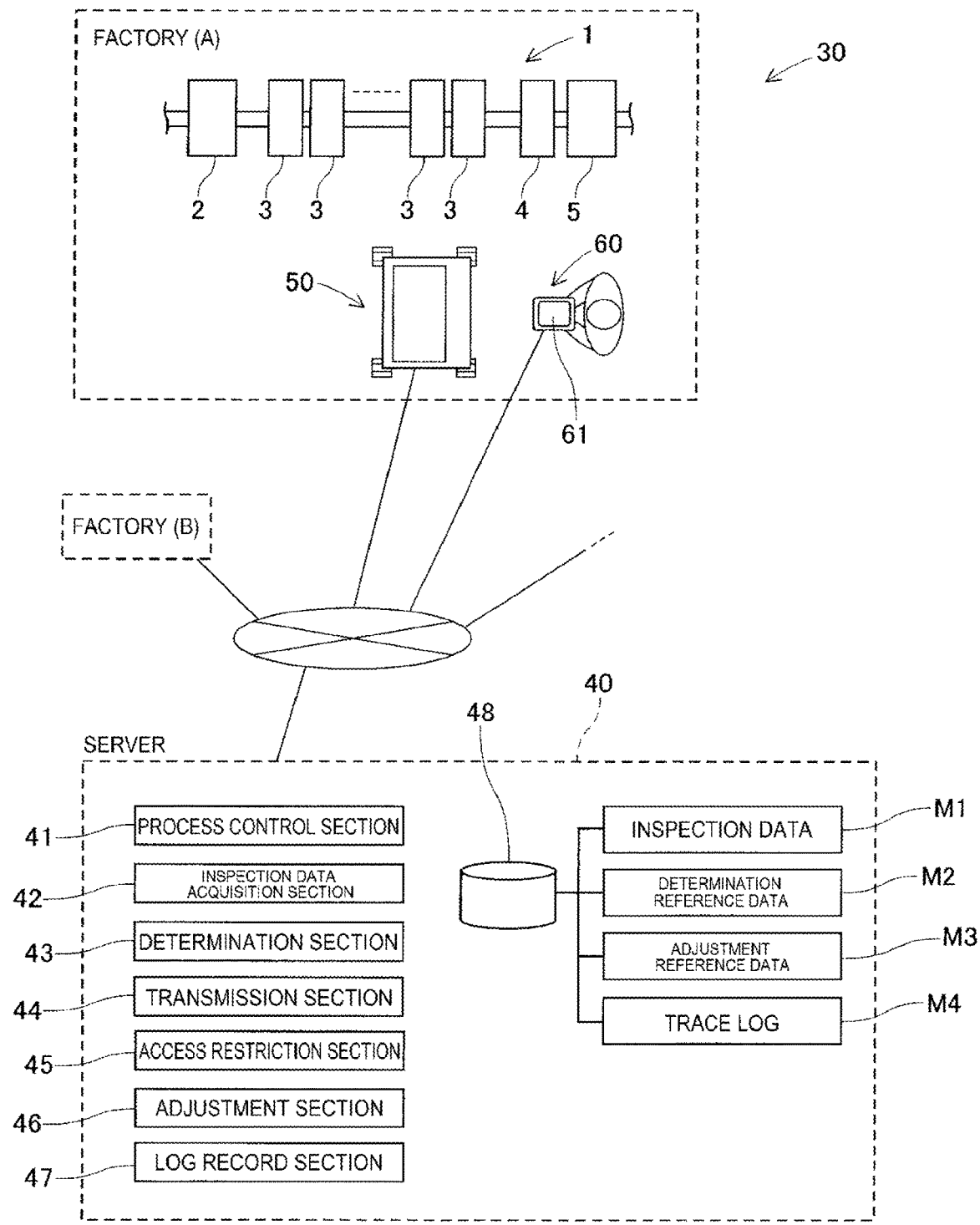
FIG. 1 is a schematic diagram showing a production line and inspection system in an embodiment.

As shown in FIG. 1, production line 1 is configured by installing multiple board work machines in a conveyance direction of board 90 (see FIG. 2) in factory A. Each of the multiple board work machines is communicably connected to a host computer (not shown) that collectively controls production line 1. Production line 1 includes printer 2, multiple component mounters 3, reflow furnace 4, and inspector 5 as multiple board work machines.

Printer 2 prints the paste-like solder at a mounting position of the components on board 90 that has been carried in. Each of multiple component mounters 3 mounts components on board 90 conveyed from the upstream side in production line 1. The configuration of component mounter 3 will be described later. Reflow furnace 4 heats board 90 conveyed from the upstream side in production line 1 and melts the solder on board 90 to perform soldering. Inspector 5 checks whether the function of the board product produced in production line 1 is normal.

The configuration of production line 1 can be appropriately added or changed depending on, for example, the type of board product to be produced. More specifically, in production line 1, a buffer device for temporarily holding board 90 to be conveyed, or a board work machine such as a board supplying device or a board flipping device, various inspection devices, a shield mounting device, an adhesive application device, a ultraviolet ray irradiation device, and the like, can be appropriately installed.

3. Configuration of Component Mounter 3

Figure 2:
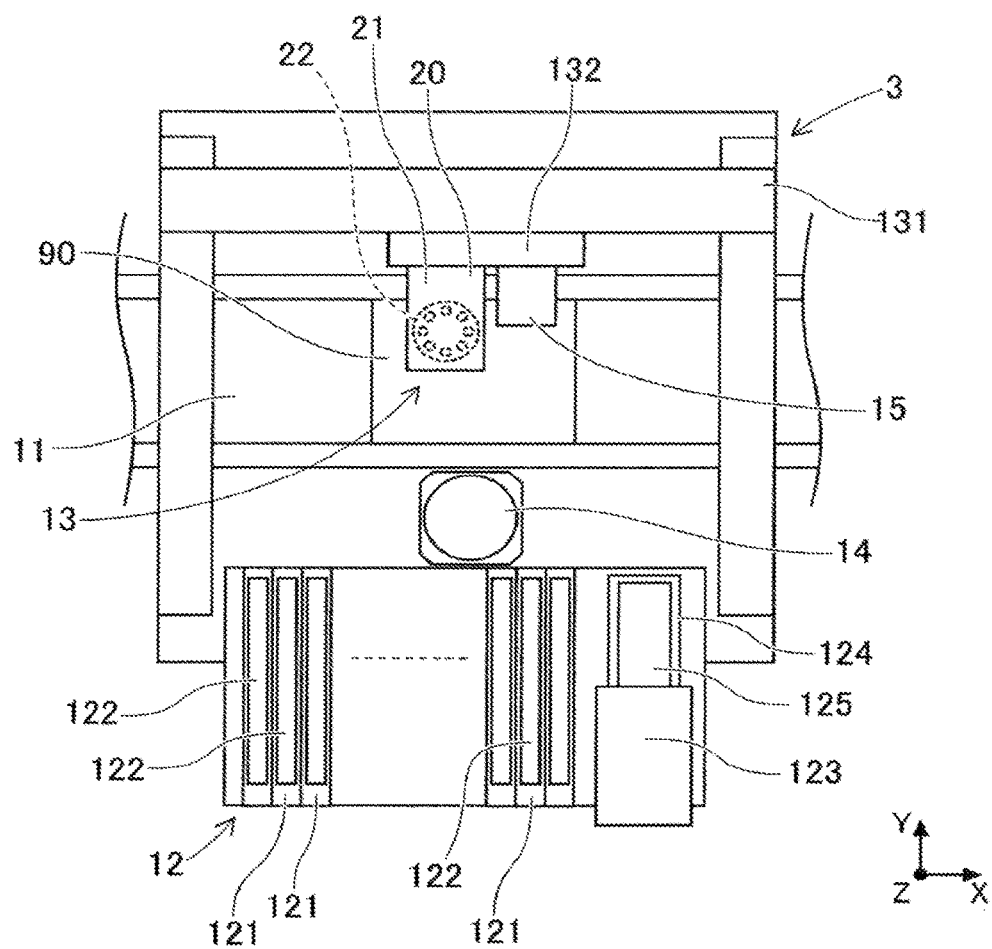
FIG. 2 is a schematic diagram showing a configuration of a component mounter in the production line of FIG. 1.

Component mounter 3 performs a mounting process of mounting components on board 90. As shown in FIG. 2, component mounter 3, board conveyance device 11, component supply device 12, component transfer device 13, part camera 14, and board camera 15. Board conveyance device 11 includes a belt conveyor, a positioning device, and the like. Board conveyance device 11 sequentially conveys board 90 in the conveyance direction, and positions board 90 at a predetermined position in the machine. After the mounting process is completed, board conveyance device 11 carries out board 90 outside the component mounter 3.

Component supply device 12 supplies components to be mounted on board 90. Component supply device 12 includes feeders 122 set in multiple slots 121. Feeder 122 feeds and moves a carrier tape storing a number of components to supply the components to be pickup conditions. Component supply device 12 supplies, for example, relatively large components in a state of being arranged on tray 125 placed on pallet 124. Housing device 123 of component supply device 12 houses multiple pallets 124, and supplies the components by pulling out predetermined pallet 124 in accordance with the mounting process.

Component transfer device 13 transfers the components supplied by component supply device 12, to a predetermined mounting position on board 90 carried into the machine by board conveyance device 11. Head driving device 131 of component transfer device 13 moves moving body 132 in the horizontal direction (X-axis direction and Y-axis direction) by a linear motion mechanism. Mounting head 20 is exchangeably fixed to moving body 132 by a clamp member (not shown). Mounting head 20 is one of the constitutive devices configuring component mounter 3. Mounting head 20 is mounted on board 90 by picking up a component and adjusting the position and angle of the component in the vertical direction. The configuration of mounting head 20 will be described later.

Part camera 14 and board camera 15 are a digital imaging device having an imaging element such as a CMOS. Part camera 14 and board camera 15 perform imaging based on the control signal, and transmit image data acquired by the imaging. Part camera 14 is configured to be capable of imaging a component held by suction nozzle 25 of mounting head 20 from below. Board camera 15 is configured to be capable of imaging board 90 from above.

Component mounter 3 having the structure as described above performs the mounting process for mounting components to board 90. In the mounting process, component mounter 3 transmits a control signal to component transfer device 13 based on information output from multiple and various sensors and the image processing result, a control program stored in advance, and the like. In this way, the position and angle of multiple suction nozzles 25 supported on mounting head 20 are controlled.

4. Configuration of Mounting Head 20

Figure 3:
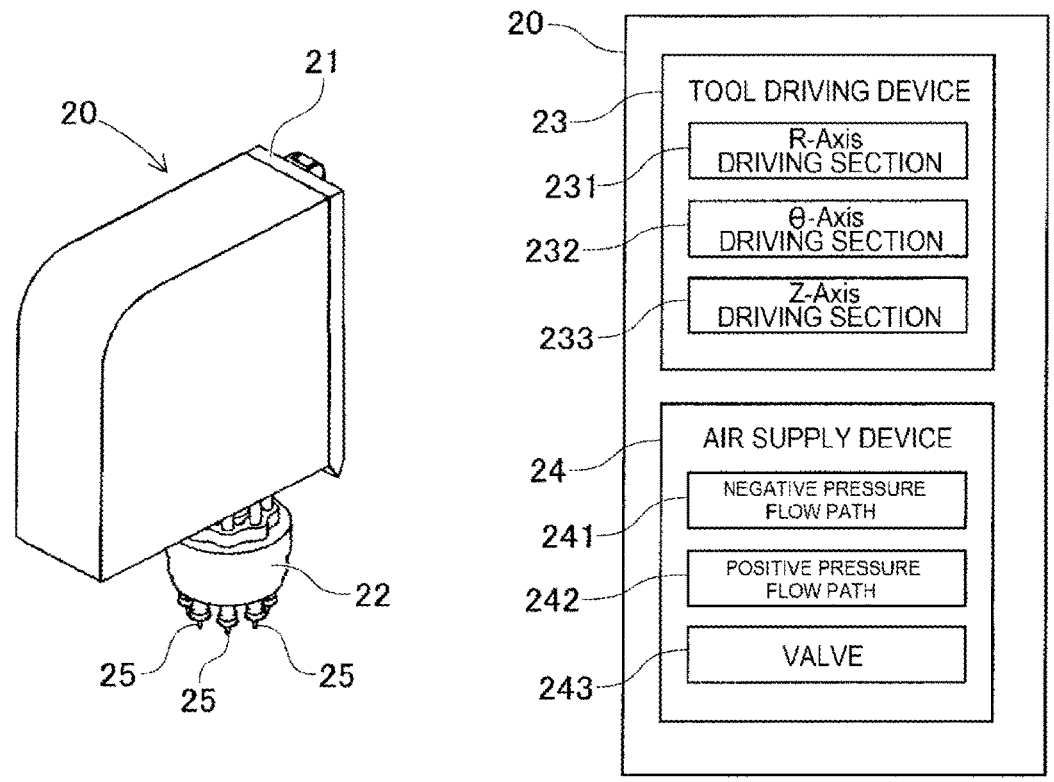
FIG. 3 is an explanatory view showing an appearance and functional block of a mounting head.

As shown in FIG. 3, mounting head 20 has head main body 21 which is clamped to moving body 132 of component transfer device 13. Head main body 21 is provided with nozzle tool 22, tool driving device 23, and air supply device 24. Nozzle tool 22 holds multiple suction nozzles 25, which are arranged at equal intervals in the circumferential direction on a circle concentric with the R-axis, to be slidable in the Z-axis direction and to be rotatable about the θ-axis. Mounting head 20 includes a type in which nozzle tool 22 is attachable and detachable, and a type in which nozzle tool 22 is integrally fixed. Above-mentioned θ-axis is a rotation axis of suction nozzle 25 that is parallel to the R-axis and passes through axes of respective suction nozzles 25.

Tool driving device 23 includes a servomotor, a speed reducer, a linear motion mechanism, or the like, and determines the angle of suction nozzle 25 around the θ-axis and the position of suction nozzle 25 in the Z-axis direction. Tool driving device 23 includes R-axis driving section 231, θ-axis driving section 232, and Z-axis driving section 233. R-axis driving section 231 rotates nozzle tool 22 about the R-axis with respect to head main body 21. θ-axis driving section 232 rotates each of multiple suction nozzles 25 around the θ-axis. Among multiple suction nozzles 25, Z-axis driving section 233 lifts and lowers one suction nozzle indexed on a predetermined position in head main body 21 in the Z-axis direction.

Air supply device 24 supplies negative pressure air or positive pressure air generated by an air pump (not shown) to suction nozzle 25 through an air flow path formed inside mounting head 20. Air supply device 24 includes negative pressure flow path 241, positive pressure flow path 242, and valve 243. Negative pressure flow path 241 is an air flow path used in supplying negative pressure air to suction nozzle 25. Positive pressure flow path 242 is an air flow path used in supplying positive pressure air to suction nozzle 25.

Valve 243 is operated, for example, by a stepping motor (not shown) to switch among the supply of negative pressure air in the air flow path, the supply of positive pressure air, and shutoff. When the negative pressure air is supplied from air supply device 24 by the switching of valve 243, suction nozzle 25 picks up and holds the component at a tip portion. Further, when the positive pressure air is supplied from air supply device 24 by the switching of valve 243, suction nozzle 25 releases the component that has been picked up at the tip portion.

5. Configuration of Inspection System 30

As shown in FIG. 1, inspection system 30 includes constitutive device quality determination server (hereinafter, simply referred to as a "server") 40, head bench 50, and terminal device 60. Server 40 is communicably connected to head bench 50 and terminal device 60 via the internet. In the present embodiment, head bench 50 is not directly communicably connected to terminal device 60. Server 40 performs a predetermined inspection on head bench 50 or terminal device 60 in accordance with an operation by an operator, and displays, on the terminal device 60, a quality determination result of mounting head 20 based on the inspection result.

In the present embodiment, server 40 is a cloud server and is communicably connected to multiple clients (e.g., multiple head benches 50 and multiple terminal devices 60). Here, head bench 50 is an inspection device that performs an inspection on mounting head 20 configuring component mounter 3 by operating mounting head 20 in accordance with the type of the inspection.

Figure 4:
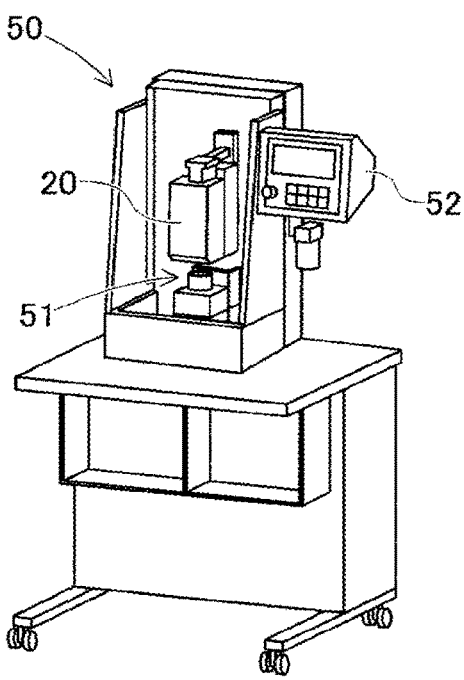
FIG. 4 is an explanatory view showing an appearance of a head bench.

Head bench 50 has mounting head 20 attached thereto by a clamping mechanism and hold mounting head 20 in an operable manner. Head bench 50 can operate tool driving device 23 of mounting head 20 that has been held, and can allow air or the like to flow through the air flow path of air supply device 24. Head bench 50 includes inspection unit 51 and control device 52, as shown in FIG. 4. Inspection unit 51, performs various inspections on mounting head 20 using a dedicated sensor or camera.

In the present embodiment, the inspection by inspection unit 51 includes inspection of mechanical accuracy of mounting head 20. Above-mentioned "inspection of mechanical accuracy" is an inspection of whether the driving section of mounting head 20 (R-axis driving section 231, θ-axis driving section 232, Z-axis driving section 233) operates mechanically accurately. For example, inspection unit 51 rotates inspection nozzle attached to mounting head 20 around the θ-axis and then rotate it reversely, measuring the rotation angle of the inspection nozzle. In this way, backlash in θ-axis driving section 232 is detected. Further, by measuring the position of the inspection nozzle before and after the driving of Z-axis driving section 233, the inclination of the holder holding suction nozzle 25 is detected.

Further, the inspection by inspection unit 51, includes inspection of operation time of the driving section of mounting head 20 (R-axis driving section 231, θ-axis driving section 232, Z-axis driving section 233). Above-mentioned "inspection of operation time" is an inspection for instructing the driving section of mounting head 20 to perform a predetermined operation and measuring a required time of the operation. The operation time of the driving section varies with a driving load depending on whether the driving section is properly lubricated, the degree of contamination, and the like. For example, inspection unit 51 moves the driving section of mounting head 20 by a predetermined distance, or rotates it by a specified angle to measure the pulse power supplied to the servomotor. In accordance with the amount of the pulse power, the operation time and the driving load of the driving section of mounting head 20 are detected.

Further, the inspection by inspection unit 51 includes inspection of the operation waveform of a servo axis included in mounting head 20. Above-mentioned "inspection of the operation waveform" an inspection for instructing the driving section of mounting head 20 to perform a predetermined operation when the driving section of mounting head 20 (R-axis driving section 231, θ-axis driving section 232, Z-axis driving section 233) uses a servomotor as a drive source, and measuring the output pulse (operation waveform) of an encoder incorporated in the servomotor in the operation. The output pulses of the servomotor vary for the same operation depending on the degree of deterioration or contamination of the constitutive components. Therefore, inspection unit 51 detects the detection position by the encoder, and the waveform of the output pulse that converges in the predetermined operation.

In addition, inspection unit 51 supplies negative pressure air or positive pressure air to the air flow path of mounting head 20 and measures the flow rate of air in negative pressure flow path 241 and positive pressure flow path 242 by a flow rate measuring sensor (not shown). In the inspection process, inspection unit 51 rotates nozzle tool 22 around the R-axis, rotates the holder holding suction nozzle 25 around the θ-axis, or lifts and lowers the holder in the Z-axis direction in a state of allowing negative pressure air or positive pressure air to flow to measure the flow rate in various states. When the flow rate in the air flow path of mounting head 20 is reduced, it is assumed that the air flow path is dirty or the lubricity of the movable section is deteriorated.

Control device 52 is a controller mainly including a CPU, various memories, and a control circuit. Control device 52 is communicably connected to server 40. Control device 52 controls the operations of mounting head 20 and various sensors such that a predetermined type of the inspection designated by the server 40 is performed. In addition, control device 52 acquires the identification code (ID) stored in mounting head 20 by communicating with mounting head 20.

In addition, control device 52 operates mounting head 20 in accordance with the type of the inspection as described above, and acquires a measured value necessary for a subsequent quality determination to generate inspection data M1. The measured value of inspection data M1 may include values measured by various sensors, such as a position of a nozzle or the like, an angle, a required time of the movable section, a pulse power, a flow rate of air, pressure, and the like. In addition, inspection data M1 may include image data used to find the position and the angle of a nozzle or the like.

Further, inspection data M1 may be used as data conforming to the inspection in place of or in addition to the measured values described above. Specifically, when the inclination of the holder supporting suction nozzle 25 is inspected, control device 52 finds the inclination angle of the holder based on the measured values indicating the position before and after the lifting and lowering of the inspection nozzle. Control device 52 may record the inclination angle in inspection data M1.

In addition, head bench 50 is limited to acquiring the measured value or finding the data conforming to the inspection in any of various inspections, and does not make quality determination using measured values, or does not specify a portion where there is a malfunction. Therefore, head bench 50 does not store important information such as determination reference data necessary for determining the quality in various inspections.

Terminal device 60 is a display device displaying various types of information. Terminal device 60 also functions as a guide device performing adjustment guide for mounting head 20. In the present embodiment, terminal device 60 includes touch screen 61 as shown in FIG. 1. Touch screen 61 displays various types of information and receives an operation by the operator. Terminal device 60 is communicably connected to server 40. In addition, terminal device 60 receives information regarding the result of quality determination and the adjustment guide from server 40, and displays the received information on touch screen 61. Terminal device 60 has a unique identification code (ID) and transmits an identification code to server 40 as necessary.

Terminal device 60 selectably displays, on touch screen 61, the type of maintenance process for mounting head 20 set on head bench 50, for example. Above-mentioned "maintenance process" includes various inspections on mounting head 20, which is one of the constitutive devices of component mounter 3, and adjustment guide based on the inspection result. When a predetermined type of maintenance process is selected by an operation on touch screen 61, terminal device 60 transmits the type of maintenance process to server 40.

Server 40 functions as a constitutive device quality determination server by the installed software. As shown in FIG. 1, server 40 includes process control section 41, inspection data acquisition section 42, determination section 43, transmission section 44, access restriction section 45, adjustment section 46, log record section 47, and storage device 48. Process control section 41 controls the operation of each section in the maintenance process, and acquires an identification code (ID) of an external device by communication. Inspection data acquisition section 42 acquires inspection data M1 obtained from a predetermined type of the inspection by head bench 50. Inspection data acquisition section 42 stores acquired inspection data M1 in storage device 48.

Here, storage device 48 may be an optical drive device such as a hard disk drive device, a flash memory, or the like. In addition to above-mentioned inspection data M1, determination reference data M2 and adjustment reference data M3 are stored in advance in storage device 48. Above-mentioned "determination reference data M2" corresponds to the range of inspection data M1 which normal mounting head 20 indicates in the inspection by head bench 50. That is, determination reference data M2 includes a range and a threshold value for mounting head 20 as an inspection target to be normal in an inspection item based on inspection data M1.

In above-mentioned "adjustment reference data M3", an adjustment position and an adjustment amount in mounting head 20 corresponding to inspection data M1 are set. That is, in adjustment reference data M3, information is set in advance which is capable of specifying the portion to be adjusted in mounting head 20 including a number of components corresponding to multiple measured values or the like included in inspection data M1, and calculating the adjustment amount for the adjustment position. Determination reference data M2 and adjustment reference data M3 are set based on a lot of results, tests, and the like, and are important data to be prevented from leaking to the outside.

Determination section 43 determines the quality of mounting head 20 based on acquired inspection data M1, and stores the quality determination result in storage device 48. The determination section 43 determines the quality of the mounting head 20 based on inspection data M1 and determination reference data M2. That is, for example, when the measured value included in inspection data M1 is included in the normal range indicated by determination reference data M2, determination section 43 determines that mounting head 20 is normal.

Further, in the quality determination, determination section 43 determines the quality level based on, for example, whether the measured value is in the vicinity of the center of the normal range, whether the measured value is in the vicinity of the boundary, or how much the measured value deviates from the normal range. Determination section 43 stores the quality level in the inspection item in storage device 48 in association with the quality determination result.

Transmission section 44 transmits the quality determination result determined by determination section 43 to terminal device 60 communicably connected via the internet. In addition, transmission section 44 transmits adjustment guide information indicating the adjustment position and the calculated adjustment amount specified by adjustment section 46, which will be described later, to terminal device 60. Terminal device 60 receives the quality determination result and the adjustment guide information, and displays them on touch screen 61.

Access restriction section 45 restricts access by terminal device 60 to determination reference data M2 or adjustment reference data M3. Specifically, for example, when terminal device 60 is communicably connected to server 40, access restriction section 45 restricts information that is accessible by specifying the client device using the identification code of terminal device 60, the IP address, or the like. Access restriction section 45 allows updating of determination reference data M2 and adjustment reference data M3 for access by the device having the management authority.

In addition, access restriction section 45 may restrict information that is accessible by user authentication in place of or in addition to the above-mentioned method. Access restriction section 45 restricts access to determination reference data M2 and adjustment reference data M3 by the client device that does not have the management authority, regardless of the method that allows communication with terminal device 60. In this way, transmission section 44 does not transmit inspection data M1, determination reference data M2, and adjustment reference data M3 to terminal device 60.

Adjustment section 46 specifies the adjustment position of mounting head 20 and calculates the adjustment amount based on inspection data M1 and adjustment reference data M3. Specifically, for example, when determination section 43 determines that mounting head 20 is in a bad quality in the quality determination, adjustment section 46 specifies the adjustment portion regarding the inspection item and calculates the adjustment amount, based on the quality level of the inspection item calculated by determination section 43 based on inspection data M1 and adjustment reference data M3. Adjustment section 46 stores, in storage device 48, the specified adjustment portion and the calculated adjustment amount as adjustment guide information.

Log record section 47 records trace log M4 that enables tracing of inspection and adjustment guide when server 40 determines the quality of mounting head 20. Above-mentioned "trace log M4" includes an operation history of mounting head 20 in the inspection. In the present embodiment, as shown in FIG. 5, log record section 47 records at least one of the identification code (ID) of mounting head 20, inspection data M1, and the identification information (ID) of terminal device 60 in association with the operation history of mounting head 20, as trace log M4.

Trace log M4 is a log in which, when inspection system 30 performs a predetermined inspection or adjustment guide, for example, instruction signals for mounting head 20, control signals of tool driving device 23 and air supply device 24 in mounting head 20, notification information of operation completion of mounting head 20, and the like, are recorded as the operation history together with time. Log record section 47 may further record communication records between server 40 and head bench 50, communication records between server 40 and terminal device 60, operation records of the operator for head bench 50 or terminal device 60, and the like, as trace log M4.

6. Maintenance process Using Inspection System 30

The maintenance process by inspection system 30 will be described with reference to FIG. 6. Mounting head 20 as the target of the maintenance process is assumed to be one whose operation time has exceeded a certain level since the last maintenance process, one after a repair such as component exchange has been made, or the like. In the maintenance process, for example, head bench 50 is transported to the installation site of component mounter 3, or mounting head 20 is transported to the installation site of head bench 50.

Figure 6:
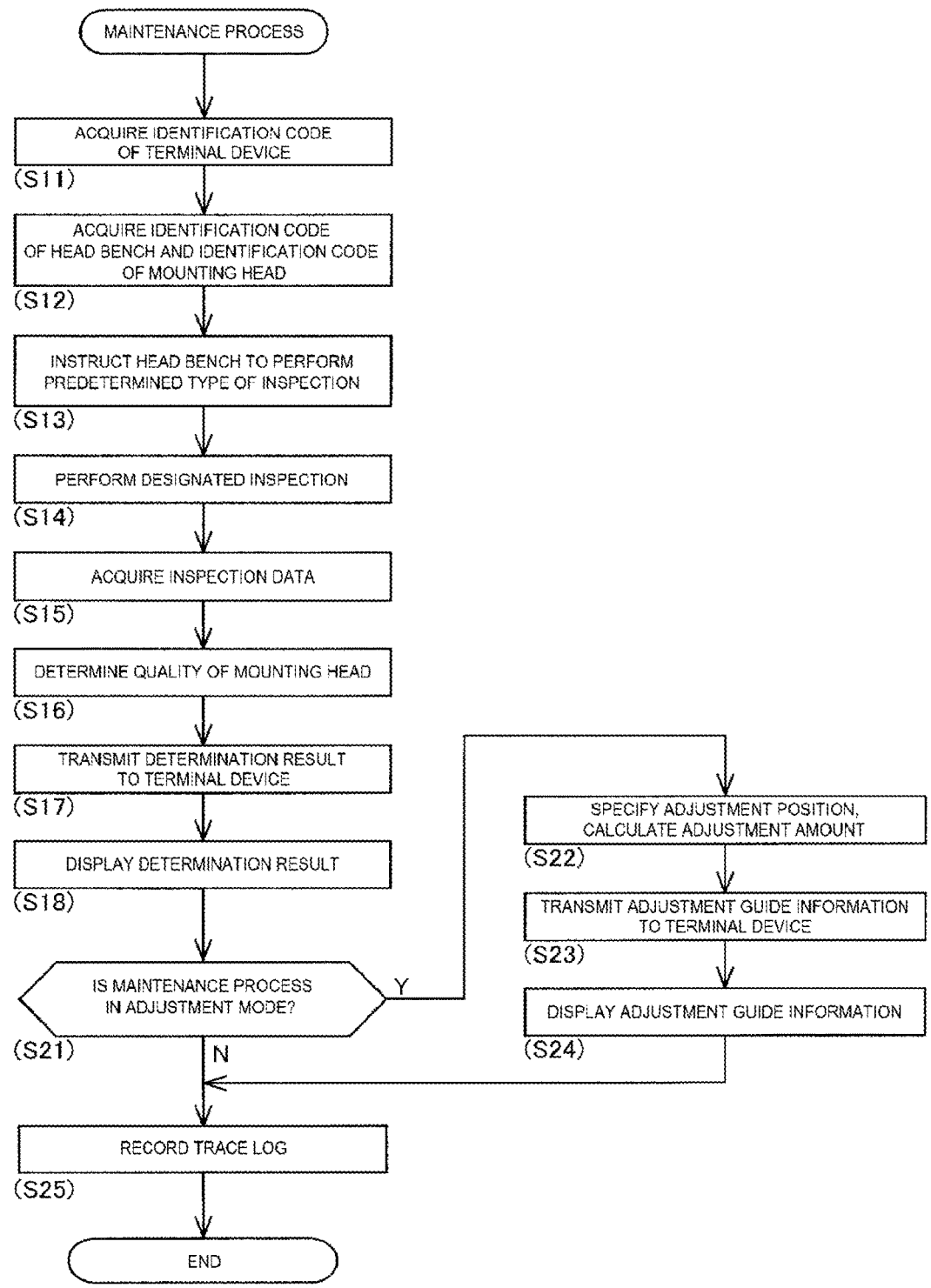
FIG. 6 is a flowchart showing a maintenance process.

When mounting head 20 is set in head bench 50 and terminal device 60 requests the start of the maintenance process, server 40 performs the maintenance process as shown in FIG. 6. It should be noted that multiple servers 40 may be operated corresponding to countries, regions, and the like. In this case, among multiple servers 40, for example, the server having the minimum communication load from the installation site of head bench 50 is selected, and the maintenance process is performed.

Process control section 41 of server 40 first acquires the identification code of terminal device 60 that has requested the start of the maintenance process (S11). Next, process control section 41 acquires the identification code of head bench 50, in which mounting head 20 designated as the processing target is set, and the identification code of specified mounting head 20 (S12). In this way, process control section 41 checks whether communication with head bench 50 is possible. In addition, process control section 41 may suspend the maintenance process when it is determined that the request to perform the maintenance process is not made by the authorized user based on the identification codes respectively acquired in S11 and S12.

Subsequently, process control section 41 designates a type of the inspection in accordance with the request from terminal device 60, and instructs head bench 50 to perform the type of the inspection (S13). More specifically, process control section 41 determines that the inspection of mechanical accuracy and the inspection of the operation time of the driving section of mounting head 20 is required in accordance with the maintenance process selected by the operator in terminal device 60, and instructs head bench 50 to perform each inspection. As described above, the type of the inspection instructed to be performed on head bench 50 varies depending on the type of the selected maintenance process.

Head bench 50 performs one or multiple designated types of inspections (S14). Control device 52 of head bench 50 generates inspection data M1. Inspection data acquisition section 42 acquires inspection data M1 obtained from a predetermined type of the inspection by head bench 50 (S15), and stores it in storage device 48. Determination section 43 determines the quality of mounting head 20 based on the acquired inspection data M1 and determination reference data M2 (S16).

Subsequently, transmission section 44 transmits the quality determination result determined by determination section 43 in S16 to terminal device 60 via the internet (S17). Terminal device 60 displays the received quality determination result on touch screen 61 (S18). In this way, the operator can determine whether it is appropriate to use mounting head 20 for the mounting process based on the quality determination result of mounting head 20.

It should be noted that on terminal device 60, the determination result regarding the quality of mounting head 20 in the selected maintenance process is displayed; whereas the inspection result of the predetermined type of the inspection performed by head bench 50 in accordance with the maintenance process is not displayed. The maintenance process includes an inspection mode in which only the inspection as described above is performed and an adjustment mode in which the adjustment is performed using the inspection result. Process control section 41 determines whether the adjustment mode is selected for the maintenance process in terminal device 60 (S21).

When the adjustment mode is selected (S21: Yes), adjustment section 46 specifies the adjustment position of mounting head 20 based on inspection data M1 and adjustment reference data M3 and calculates the adjustment amount (S22), and stores the adjustment amount in storage device 48 as adjustment guide information. Subsequently, transmission section 44 transmits the adjustment guide information generated by adjustment section 46 in S22 to terminal device 60 via the internet (S23). Terminal device 60 displays the received adjustment guide information on touch screen 61

(S24). As a result, the operator can recognize, based on the adjustment guide information, which portion of mounting head 20 should be the adjustment target and what extent the adjustment amount should be adjusted.

On the other hand, when the inspection mode is selected for the maintenance process (S21: NO), the adjustment-related process above-described (S22 to S24) is omitted. Thereafter, log record section 47 records the identification code of mounting head 20, inspection data M1, and the identification information of terminal device 60 in association with the operation history of mounting head 20, as trace log M4 (S25). Further, log record section 47 records the communication record between server 40 and the external device (head bench 50, terminal device 60) and the operation record for the external device, as trace log M4.

7. Access Restriction Process to Server 40

Figure 7:
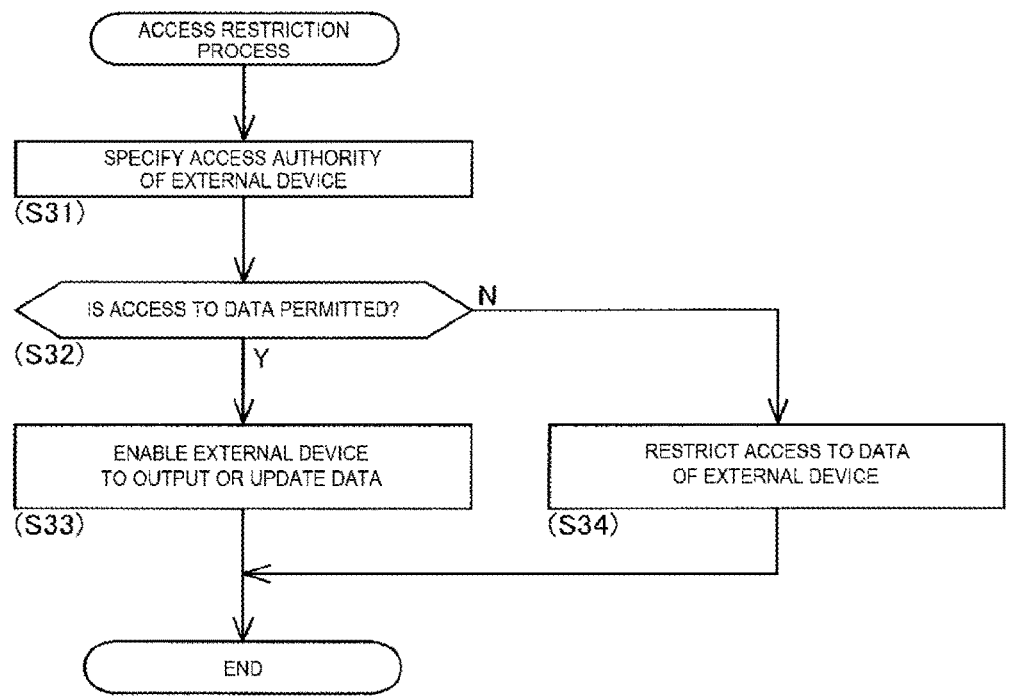
FIG. 7 is a flowchart showing an access restriction process.

An access restriction process performed by access restriction section 45 will be described with reference to FIG. 7. Access restriction section 45 performs the access restriction process as shown in FIG. 7 when an external device accesses various types of data. Here, the above-mentioned external device includes a client device such as head bench 50 and terminal device 60. The client device includes a management device having a management authority.

Access restriction section 45 first specifies the access authority of the external device that has accessed (S31). The access authority specifies the client device using the identification code and the like of the external device, or is specified by user authentication. Next, access restriction section 45 determines whether to permit access to the data in accordance with the access authority specified in S31 (S32). When access to the data is permitted (S32: Yes), access restriction section 45 enables the external device to output or update the data (S33).

On the other hand, when the access to the data is not permitted (S32: No), access restriction section 45 restricts the access to the data of the external device (S34). Specifically, for example, when an external device is head bench 50 or terminal device 60 and the data for which the access request has been made is determination reference data M2 or adjustment reference data M3, access restriction section 45 restricts the access to the data and does not transmit the data to the external device.

8. Effects of Configuration of Embodiment

Server 40 in the present embodiment is a server that is communicably connected to head bench 50 via the internet, head bench 50 performing an inspection on mounting head 20 configuring component mounter 3 by operating mounting head 20 in accordance with the type of the inspection. Server 40 includes inspection data acquisition section 42 that designates a predetermined type of the inspection on head bench 50 and acquires inspection data M1 obtained by the inspection by head bench 50, determination section 43 that determines the quality of mounting head 20 based on acquired inspection data M1, and transmission section 44 that transmits the quality determination result determined by determination section 43 to terminal device 60 communicably connected via the internet.

With such a configuration, server 40 in inspection system 30 is configured as a separate device connected to head bench 50 performing the inspection and terminal device 60 displaying the quality determination result, via the internet. In this way, by transporting head bench 50 to the installation site of component mounter 3, or by transporting mounting head 20 to the installation site of head bench 50, it is possible to perform the maintenance process and to improve convenience. On the other hand, since the quality determination is performed by server 40, head bench 50 and terminal device 60 are separated from important information for inspection such as determination reference data M2. Therefore, it is possible to reliably prevent such leakage of information, and it is possible to improve the manageability of the maintenance process for mounting head 20.

Further, in the case of inspection system 30 having the configuration as exemplified in the embodiment, access to server 40 from the device having the management authority is possible. Therefore, an administrator of inspection system 30 can, for example, collect and analyze inspection results by a number of inspection devices (head bench 50). Further, the administrator of inspection system 30 can update determination reference data M2 and adjustment reference data M3 to more appropriate ones based on the analysis result. In this way, in the subsequent maintenance process, updated determination reference data M2 and adjustment reference data M3 are reflected, and thus more appropriate maintenance process can be performed.

9. Modified Aspect of Embodiment

9-1. Regarding Inspection Device

In an embodiment, inspection system 30 includes head bench 50 as an inspection device. In contrast, in addition to head bench 50, the inspection device may employ an aspect in which the inspection device is incorporated in the board work machine performing a board work using a constitutive device. For example, the inspection device may be incorporated in component mounter 3 to inspect mounting head 20 based on the image data acquired by imaging of part camera 14.

With such a configuration, the inspection device of component mounter 3 moves mounting head 20 in a predetermined operation, and images the state before and after the operation by part camera 14 or the like. Then, the inspection device measures the operation amount, the required time, or the like of mounting head 20 based on the image data acquired by imaging, and generates inspection data M1 in the same manner as in the embodiment. Server 40 determines the quality of mounting head 20 based on inspection data M1 and determination reference data M2.

Here, component mounter 3 may employ a configuration in which an inspection of mounting head 20 is performed using part camera 14 or the like, which is the existing equipment, and the inspection result is used, for example, for calibrating the operation of mounting head 20. However, in a configuration in which mounting head 20 in component mounter 3 can be inspected as described above, important information for inspection such as the determination reference data may be leaked. In contrast, according to the above-described configuration, since the function of performing the quality determination is separated from the inspection device incorporated in component mounter 3, it is possible to improve manageability of the inspection device in component mounter 3. Thus, it is possible to incorporate the inspection device in component mounter 3, and it is possible to improve the convenience of maintenance. The inspection device may have a configuration in which a function of performing adjustment guide is omitted.

9-2. Regarding Board Work Machine and Constituent Device

In the embodiment, the constitutive device to be inspected by inspection system 30 has been described as being mounting head 20. On the other hand, inspection system 30 may perform inspection on various constitutive devices configuring component mounter 3. Specifically, the inspection system 30 may inspect any one of board conveyance device 11, component supply device 12, feeder 122, housing device 123, and component transfer device 13.

Further, in the embodiment, the board work machine including a constitutive device has been described as being component mounter 3. In contrast, inspection system 30 may set constitutive devices of the various board work machines constituting production line 1, as the inspection target. Specifically, the board work machine may be one of devices by which production line 1 is configured, such as a printer, a reflow furnace, an inspector, and a buffer device.

REFERENCE SIGNS LIST

3: Component mounter (board work machine), 20: Mounting head (constitutive device), 30: Inspection system, 40: Server (constitutive device quality determination server), 41: Process control section, 42: Inspection data acquisition section, 43: Determination section, 44: Transmission section, 45: Access restriction section, 46: Adjustment section, 47: Log record section, 48: Storage device, 50: Head bench (Inspection device), 51: Inspection unit, 52: Control device, 60: Terminal device, 61: Touch screen

The invention claimed is:

1. A constitutive device quality determination server that is communicably connected to an inspection device via the internet, the inspection device performing an inspection on a constitutive device by operating the constitutive device in accordance with a type of the inspection, the server comprising:
   a process control section configured to instruct the inspection device to perform a predetermined type of the inspection on the constitutive device;
   an inspection data acquisition section configured to acquire inspection data obtained from the predetermined type of the inspection of the constitutive device by the inspection device;
   a determination section configured to determine a quality of the constitutive device based on the acquired inspection data and determination reference data; and
   a transmission section configured to transmit a quality determination result determined by the determination section to a terminal device communicably connected via the internet,
   wherein the constitutive device is a portion of a board work machine.

2. The constitutive device quality determination server according to claim 1,
   wherein the constitutive device quality determination server is configured to store, in advance, the determination reference data corresponding to a range of the inspection data which the constitutive device when normal indicates in the inspection by the inspection device.

3. The constitutive device quality determination server according to claim 2, further comprising:
   an access restriction section configured to restrict access to the determination reference data from the terminal device.

4. The constitutive device quality determination server according to claim 1,
   wherein the inspection by the inspection device includes at least one of an inspection of mechanical accuracy of the constitutive device, an inspection of an operation time of a drive mechanism included in the constitutive device, and an inspection of an operation waveform of a servo axis included in the constitutive device.

5. The constitutive device quality determination server according to claim 1,
   wherein the constitutive device quality determination server is configured to store, in advance, adjustment reference data in which an adjustment position and an adjustment amount in the constitutive device corresponding to the inspection data are set,
   the constitutive device quality determination server further comprises an adjustment section configured to specify the adjustment position and calculate the adjustment amount based on the inspection data and the adjustment reference data, and
   the transmission section is configured to transmit the adjustment position and the adjustment amount, which are specified and calculated by the adjustment section, to the terminal device.

6. The constitutive device quality determination server according to claim 5, further comprising:
   an access restriction section configured to restrict access to the adjustment reference data from the terminal device.

7. The constitutive device quality determination server according to claim 1, further comprising:
   a log record section configured to record a trace log including an operation history of the constitutive device when the quality of the constitutive device is determined.

8. The constitutive device quality determination server according to claim 7,
   wherein the log record section is configured to record at least one of an identification code of the constitutive device, the inspection data, and identification information of the terminal device in association with the operation history of the constitutive device, as the trace log.

9. The constitutive device quality determination server according to claim 1,
   wherein the board work machine is a component mounter that picks up a supplied component and mounts the component on a board, and
   the constitutive device is a mounting head that picks up the component and adjusts a vertical direction position and an angle of the component to mount the component on the board.

10. The constitutive device quality determination server according to claim 9,
    wherein the inspection device is a head bench that operatively holds the mounting head and has a sensor detecting an operation state of a movable section of the mounting head.

11. The constitutive device quality determination server according to claim 9,
    wherein the component mounter includes a part camera that images the component held by the mounting head, and the inspection device is incorporated in the component mounter and inspects the mounting head based on image data acquired by imaging of the part camera.

12. An inspection system comprising:
a terminal device configured to display various types of information;
an inspection device configured to perform an inspection on a constitutive device by operating the constitutive device in accordance with a type of the inspection; and
a constitutive device quality determination server communicably connected to the terminal device and the inspection device via the internet, and configured to
instruct the inspection device to perform a predetermined type of the inspection on the constitutive device,
acquire inspection data obtained from the predetermined type of the inspection of the constitutive device by the inspection device,
determine a quality of the constitutive device based on the acquired inspection data and determination reference data, and
transmit a quality determination result to the terminal device via the internet,
wherein the constitutive device is a portion of a board work machine.

13. A terminal device for an inspection system that is applied to an inspection system for a constitutive device and that displays various types of information,
wherein the inspection system includes:
an inspection device configured to perform an inspection on the constitutive device by operating the constitutive device in accordance with a type of the inspection; and
a constitutive device quality determination server communicably connected to the terminal device and the inspection device via the internet, and configured to instruct the inspection device to perform a predetermined type of the inspection on the constitutive device, acquire inspection data obtained from the predetermined type of the inspection of the constitutive device by the inspection device, and determine a quality of the constitutive device based on the acquired inspection data and determination reference data,
wherein the constitutive device is a portion of a board work machine, and
wherein the terminal device displays a quality determination result of the constitutive devices transmitted from the constitutive device quality determination server via the internet.

14. An inspection device for an inspection system that is applied to an inspection system for a constitutive device and that performs an inspection on the constitutive device by operating the constitutive device in accordance with a type of the inspection,
wherein the inspection system includes:
a terminal device configured to display various types of information;
a constitutive device quality determination server communicably connected to the inspection device and the terminal device via the internet, and configured to instruct the inspection device to perform a predetermined type of the inspection on the constitutive device, acquire inspection data obtained from the predetermined type of the inspection of the constitutive device by the inspection device, determine a quality of the constitutive device based on the acquired inspection data and determination reference data, and transmit a quality determination result to the terminal device via the internet,
wherein the constitutive device is a portion of a board work machine, and
wherein the inspection device is configured to perform the predetermined type of the inspection instructed by the constitutive device quality determination server and transmit the inspection data obtained by the inspection to the constitutive device quality determination server.

15. The constitutive device quality determination server according to claim 1, wherein the inspection device and the terminal device are separate from and movable relative to the board work machine.

* * * * *